US009018986B2

(12) United States Patent
Lee

(10) Patent No.: US 9,018,986 B2
(45) Date of Patent: Apr. 28, 2015

(54) OUTPUT BUFFERS

(71) Applicant: VIA Technologies, Inc., New Taipei (TW)

(72) Inventor: Yeong-Sheng Lee, Fremont, CA (US)

(73) Assignee: VIA Technologies, Inc., New Taipei (TW)

( * ) Notice: Subject to any disclaimer, the term of this patent is extended or adjusted under 35 U.S.C. 154(b) by 104 days.

(21) Appl. No.: 13/745,991

(22) Filed: Jan. 21, 2013

(65) Prior Publication Data

US 2014/0203865 A1 Jul. 24, 2014

(51) Int. Cl.
*H03K 3/00* (2006.01)
*G05F 3/24* (2006.01)

(52) U.S. Cl.
CPC .................................... *G05F 3/24* (2013.01)

(58) Field of Classification Search
USPC ...................................................... 327/112
See application file for complete search history.

(56) References Cited

U.S. PATENT DOCUMENTS 4,877,975 A * 10/1989 Ueno .............................. 326/23
6,054,888 A * 4/2000 Maley ........................... 327/333
7,138,836 B2 * 11/2006 Ajit et al. ...................... 327/108
2004/0178832 A1 * 9/2004 Torres et al. .................. 327/112
2005/0052201 A1 * 3/2005 Bernard et al. ................. 326/82

* cited by examiner

*Primary Examiner* — Lincoln Donovan
*Assistant Examiner* — Patrick Chen
(74) *Attorney, Agent, or Firm* — McClure, Qualey & Rodack, LLP

(57) ABSTRACT

An output buffer is provided. The output buffer is coupled to a first voltage source providing a first supply voltage and used for generating an output signal at an output terminal according to an input signal. The output buffer includes first and second transistors and a self-bias circuit. The first and second transistors are cascaded between the output terminal and a reference voltage. The self-bias circuit is coupled to the output terminal and the control electrode of the first transistor. When the output buffer does not receive the first supply voltage, the self-bias circuit provides a first bias voltage to the control electrode of the first transistor according to the output signal to decrease voltage differences between the control electrode and the input and output electrodes of the first transistor to be lower than a predetermined voltage.

17 Claims, 3 Drawing Sheets

OUTPUT BUFFERS

BACKGROUND OF THE INVENTION

1. Field of the Invention

The invention relates to an output buffer, and more particularly, to an output buffer with high voltage tolerance.

2. Description of the Related Art

Nowadays, in advanced CMOS (Complementary Metal-Oxide-Semiconductor) processes (such as 28 nm processes), the gate oxide breakdown voltage and drain-source punch-through voltage of MOS transistors are lower as compared with previous processes (such as 40 nm processes). High voltage devices cannot be manufactured by the advanced CMOS processes. For example, 3.3V devices may not be manufactured by the 28 nm processes. However, some peripheral components or other ICs not manufactured by advanced processes may still operate in high voltages such as 3.3V. The signals generated in the peripheral components or other ICs may have high voltage levels. When the MOS transistors fabricated with the 28 nm processes receive these signals, the MOS transistors may be damaged by the high voltage levels. For example, high voltage differences between the gate and source/drain of the MOS transistors (i.e. large Vgs or Vgd) may result in gate oxide breakdown, and high voltage differences between the source and drain of the MOS transistors (i.e. large Vds) may result in punch-through. Therefore, it is critical to prevent the Vgs, Vgd, and Vds of the MOS transistors from exceeding a certain limit. For the case of MOS transistors fabricated with the 28 nm processes, the Vgs, Vgd, and Vds should remain below about 1.8V to prevent such damages.

BRIEF SUMMARY OF THE INVENTION

It is desirable to provide an output buffer with high voltage tolerance, which can prevent MOS transistors of the output buffer from being damaged by external signals with high voltage levels.

An exemplary embodiment of an output buffer is provided. The output buffer is coupled to a first voltage source providing by a first supply voltage and used for generating an output signal at an output terminal according to input signal. The output buffer comprises a first transistor, a second transistor, and a self-bias circuit. The first transistor has a control electrode, an input electrode coupled to the output terminal, and an output electrode. The second transistor has a control electrode, an input electrode coupled to the output electrode of the first transistor, and an output electrode coupled to a reference voltage. The self-bias circuit is coupled to the output terminal and the control electrode of the first transistor. When the output buffer does not receive the first supply voltage, the self-bias circuit provides a first bias voltage at the control electrode of the first transistor according to the output signal to decrease voltage differences between the control electrode and the input and output electrodes of the first transistor to be lower than a predetermined voltage.

Another exemplary embodiment of an output buffer is provided. The output buffer is coupled to a first voltage source providing a first supply voltage and used for generating an output signal at an output terminal according to an input signal. The output buffer comprises a first transistor, a second transistor, a first diode, a third transistor, and a fourth transistor. The first transistor has a control electrode, an input electrode coupled to the first voltage source, and an output electrode. The second transistor has a control electrode, an input electrode coupled to the output electrode of the first transistor, and an output electrode. The first diode has an anode coupled to the output electrode of the second transistor and a cathode coupled to the output terminal. The third transistor has a control electrode, an input electrode coupled to the output terminal, and an output electrode. The fourth transistor has a control electrode, an input electrode coupled to the output electrode of the third transistor, and an output electrode coupled to a reference voltage. The self-bias circuit is coupled to the output terminal and the control electrode of the third transistor. When the output buffer does not receive the first supply voltage, the self-bias circuit provides a first bias voltage at the control electrode of the first transistor according to the output signal to decrease voltage differences between the control electrode and the input and output electrodes of the third transistor to be lower than a predetermined voltage. The control electrodes of the first transistor and the second transistor are controlled according to the input signal.

Further another exemplary embodiment of an output buffer is provided. The output buffer is used for generating an output signal at an output terminal according to an input signal. The output buffer comprises a first transistor, a second transistor, and a first diode. The first transistor has a control electrode, an input electrode coupled to a voltage source, and an output electrode. The second transistor has a control electrode, an input electrode coupled to the output electrode of the first transistor, and an output electrode. The first diode has an anode coupled to the output electrode of the second transistor and a cathode coupled to the output terminal. The driving circuit is coupled to the control electrodes of the first and second transistors. The driving circuit drives the first and second transistor according to the input signal.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is made for the purpose of illustrating the general principles of the invention and should not be taken in a limiting sense. The scope of the invention is best determined by reference to the appended claims.

In a large electronic system having multiple sub-systems, such as in a computer system, there are generally multiple power levels. The sub-systems, such as integrated circuits (ICs) and chips in the system often require different power voltages. Therefore, to protect the subsystems from being damaged by the different power voltages, an input/output buffer circuit is generally provided between the sub-systems. In a system having a first circuit on a first chip, a second circuit on a second chip, and an input/output buffer circuit coupled in between, the power supply of the first circuit (denoted as VDD) may have a lower voltage level than that of the second circuit (denoted as VPP). For example, the first circuit may operate at a power level (VDD) of 1.8V or 2.5V and the second circuit may operate at a power level (VPP) of 3.3V or 5V. The input/output buffer circuits operates in a transmit mode when the buffer receives signals from the first circuit and outputs signals to the second circuit, and operates in a receive mode when the buffer receives signals from the second circuit and outputs signals back to the first circuit. However, problems may occur when the input/output buffer circuit receives signals from a circuit having a higher voltage. Such problems, such as gate oxide breakdown and punch-through, are even more serious in ICs using advanced processes such as the 28 nm processes.

Figure 1A:
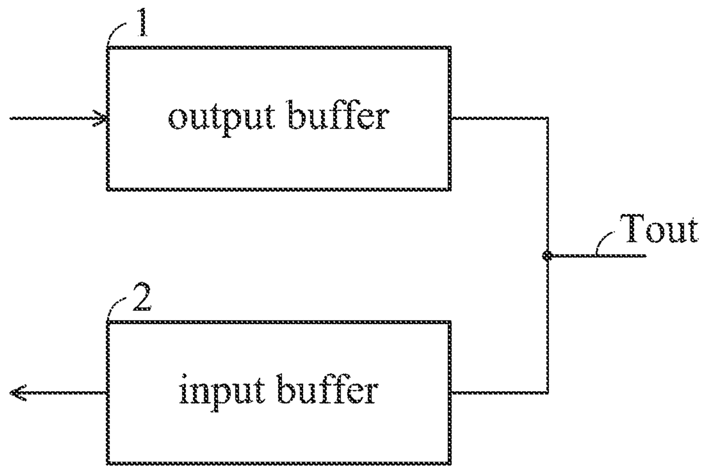
FIG. 1A shows an exemplary embodiment of an input/output buffer at an output terminal.
Figure 1B:
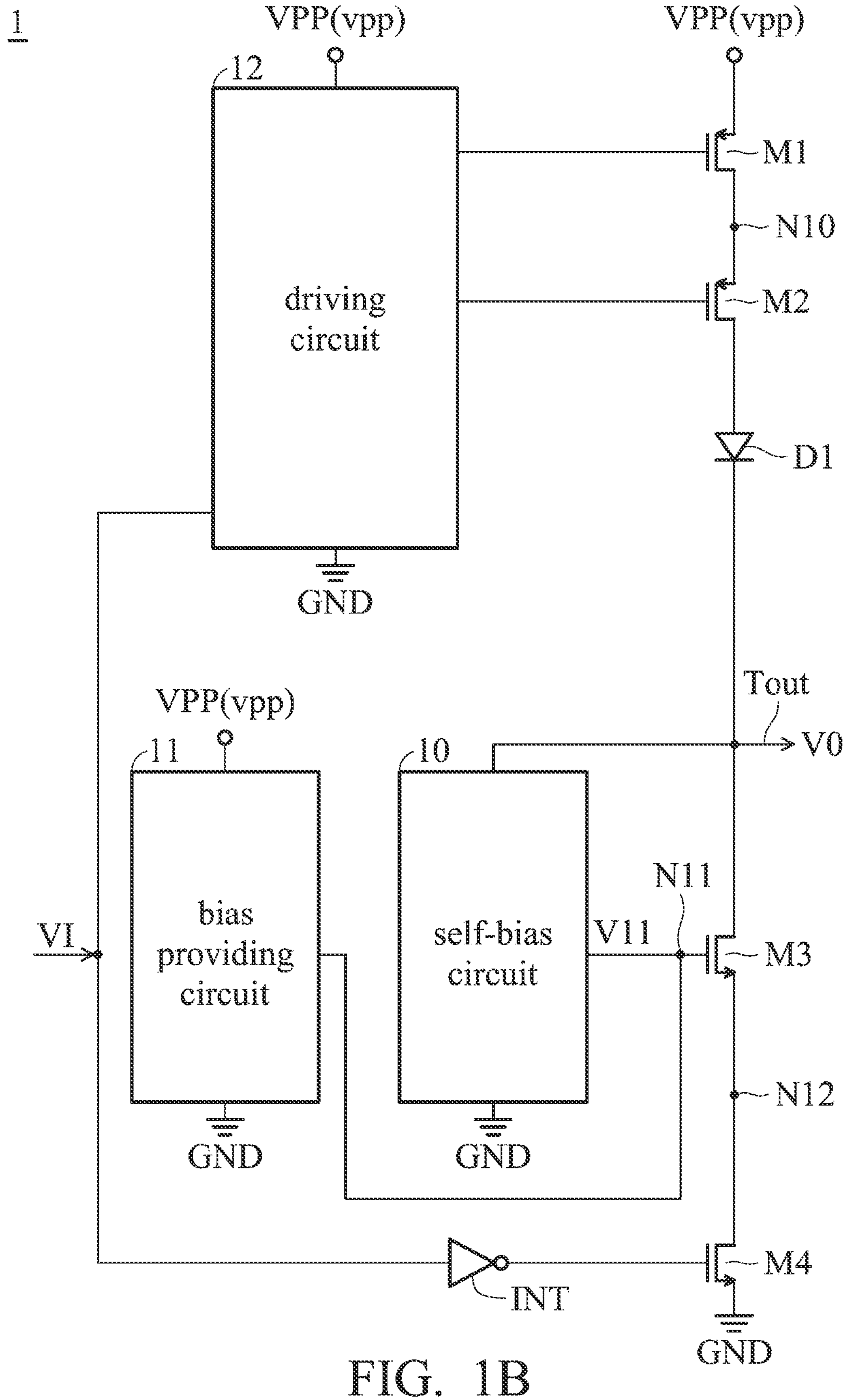
FIG. 1B shows an exemplary embodiment of an output buffer.

FIG. 1A shows an exemplary embodiment of an input/output buffer at an output terminal Tout. Referring to FIG. 1A, the input/output buffer comprises an output buffer 1 and an input buffer 2. The output buffer 1 may be responsible for the transmit mode when the input/output buffer receives signals from the first circuit and outputs signals at the output terminal Tout to the second circuit, and the input buffer 2 may be responsible for the receive mode when the input/output buffer receives signals at the output terminal Tout from the second circuit and outputs signals back to the first circuit. In an exemplary embodiment of FIG. 1, the output buffer 1 receives an input signal VI and generates an output signal VO at an output terminal Tout according to the input signal VI. Referring to FIG. 1, the output buffer 1 comprises MOS (Metal-Oxide-Semiconductor) transistors M1~M4, a diode D1, an inverter INT, a self-bias circuit 10, a bias providing circuit 11, and a driving circuit 12. Each of the MOS transistors M1~M4 has a control electrode, an input electrode, and an output electrode. In the embodiment, the MOS transistors M1 and M2 are implemented by PMOS transistors, and a gate, source, and drain of a PMOS transistor serve as the control electrode, the input electrode, and the output electrode of each of the MOS transistors M1 and M2, respectively. Moreover, in the embodiment, the MOS transistors M3 and M4 are implemented by NMOS transistors, and a gate, drain, and source of an NMOS transistor serve as the control electrode, the input electrode, and the output electrode of each of the MOS transistors M3 and M4, respectively. The gate of the PMOS transistor M1 is coupled to the driving circuit 12, the source thereof is coupled to a voltage source VPP, and the drain thereof is coupled to the joint node N10. The gate of the PMOS transistor M2 is coupled to the driving circuit 12, and the source thereof is coupled to the drain of the PMOS transistor M1 at the joint node N10. The anode of the diode D1 is coupled to the drain of the PMOS transistor M2, and the cathode thereof is coupled to the output terminal Tout. The driving circuit 12 may control the PMOS transistors M1 and M2 according to the input signal VI. According to the connection structure of the PMOS transistors M1 and M2, the PMOS transistors M1 and M2 are cascaded between the voltage source VPP and the output terminal Tout. While two stages of cascade are used here as an example, the number of cascaded stages is not limited thereto. The gate of the NMOS transistor M3 is coupled to the self-bias circuit 10 and the bias providing circuit 11 at a node N11, the drain thereof is coupled to the output terminal Tout, and the source thereof is coupled to a joint node N12. The input terminal of the inverter INT receives the input signal VI. The gate of the NMOS transistor M4 is coupled to the output terminal of the inverter INT, the drain thereof is coupled to the source of the NMOS transistor M3 at the joint node N12, and the source thereof is coupled to a reference voltage GND (such as 0V). Thus, the NMOS transistor M4 may be controlled by the input signal VI. According to the connection structure of the NMOS transistors M3 and M4, the NMOS transistors M3 and M4 are cascaded between the output terminal Tout and the reference voltage GND. The transistors M1~M4 form a CMOS structure. In the embodiment, the transistors M1~M3 are manufactured by an advanced CMOS process, such as a 28 nm process. The bias providing circuit 11 and the driving circuit 12 may receive voltages from the voltage source VPP to operate, and the self-bias circuit 10 may not receive voltages from any voltage source to operate.

Referring to FIG. 1, the voltage source VPP provides a supply voltage vpp to the output buffer 1 for driving the output signal VO transmitted to external high voltage circuits or ICs. In the embodiment, depending on the level of the supply voltage vpp, the output buffer 1 may operate in a normal mode or a power-down mode. When the supply voltage vpp is at a power-on level, such as 3.3V, the output buffer 1 operates in the normal mode. When the supply voltage vpp is at a power-off level, such as 0V, the output buffer 1 operates in the power-down mode. During the normal mode, the output signal VO is switched between a high level (such as 3.3V) and a low level (such as 0V) according to the input signal VI. The output signal VO is at the high level according to the input signal VI with a logic value "1" and at the low level in response to a logic value "0". The self-bias circuit 10 and the bias providing circuit 11 are designed such that during the normal mode, the voltage V11 at the node N11 is dominated by the bias providing circuit 11 and the effect of the self-bias circuit 10 is negligible; during the power-down mode, the voltage V11 is determined by the self-bias circuit 10 and the bias providing circuit 11 may not have effect (described later).

During the normal mode, when the input signal VI has a logic value "1," the driving circuit 12 may control the transistors M1 and M2 to turn on and the transistor M4 may turn off. Therefore, the output signal VO is at the high level such as 3.3V, and the voltage at the joint node N12 between the cascaded NMOS transistors M3 and M4 is equal to about 1.65V due to average voltage division among M3 and M4. Accordingly, the voltage difference (the drain-source voltage, Vds=3.3V−1.65V=1.65V) between the drain and source of each of the NMOS transistors M3 and M4 is lower than a predetermined voltage limit for devices fabricated by the 28 nm process, such as 1.8V (in the example, the drain-source punch-through voltage may be 1.8V for 28 nm processes). Moreover, the bias providing circuit 11 provides a designated bias voltage V11 at the gate of the NMOS transistor M3 (that is, the node N11) according to the voltage source VPP. Due to the designated bias voltage V11, the voltage differences (the gate-drain voltage Vgd and the gate-source voltage Vgs) between the gate and drain/source of the NMOS transistor M3 are controlled to be lower than a predetermined voltage such as 1.8V to prevent gate oxide breakdown in M3. At this time, the gate of the NMOS transistor M4 is at a low level such as 0V. Thus, the voltage differences (Vgd and Vgs) between the gate and drain/source of the NMOS transistor M4 are also lower than the predetermined voltage of 1.8V. Note that, the voltage difference between the two electrodes described above means that the larger voltage value is subtracted by the smaller voltage value to obtain the difference; that is, it is the absolute value of the difference value between the voltages at the two electrodes. This definition is used from here forth, thus, repeated descriptions are omitted. According to the above description, when the output signal VO is at the high level such as 3.3V during the normal mode, the significant voltage differences of the NMOS transistors M3 and M4 are in the safe region; that is, lower than the predetermined voltage limits for gate oxide breakdown and punch-through, such that the NMOS transistors M3 and M4 may not be damaged by the large voltage difference between the output signal VO with the high level and the ground voltage.

Moreover, during the normal mode, when the input signal VI has a logic value "0," the driving circuit 12 may control the transistors M1 and M2 to turn off and the transistor M4 may turn on. Therefore, the output signal VO is at the low level such as 0V, and, for the case of a 3.3V VPP, the voltage at the joint node N10 between the cascaded PMOS transistors M1 and M2 is equal to about 1.65V due to average voltage division. Accordingly, the voltage difference (Vds=3.3V−1.65V=1.65V) between the drain and source of each of the PMOS transistors M1 and M2 is lower than the predetermined voltage of 1.8V. According to the above description, when the output signal VO is at the low level of 0V during the normal mode, the significant voltage differences of the PMOS transistors M1 and M2 are in the safe region, such that the PMOS transistors M1 and M2 may not be damaged by the large voltage difference between VPP and the output signal VO with the low level. In the embodiment, the output signal VO has a voltage swing from the supply voltage vpp to the reference voltage.

During the power-down mode, the voltage source VPP does not provide the supply voltage vpp to the output buffer 1. In one embodiment, the voltage source VPP may be at a ground voltage (such as 0V) during the power-down mode. Therefore, the output buffer 1 does not output VO to external high voltage circuits or ICs. However, since the input/output buffer may receive signals from external high voltage circuits at the output terminal Tout, the output terminal Tout may be driven by the external circuits or ICs of the output buffer 1 to be at the high level such as 3.3V. Under such circumstances, the voltage at the joint node N12 between the cascaded NMOS transistors M3 and M4 is equal to about 1.65V. Accordingly, the voltage difference (Vds=3.3V−1.65V=1.65V) between the drain and source of each of the NMOS transistors M3 and M4 is lower than the predetermined voltage of 1.8V. Moreover, although the bias providing circuit 11 does not have effect, the self-bias circuit 10 may provide a bias voltage V11 to the gate of the NMOS transistor M3 (that is the node N11) according to the voltage at the output terminal Tout and without receiving voltages from any voltage source. Due to the providing of the bias voltage V11, the voltage differences (Vgd and Vgs) between the gate and drain/source of the NMOS transistor M3 are controlled to be lower than the predetermined voltage of 1.8V.

Moreover, due to the existence of the diode D1 between the PMOS transistors M1 and M2 and the output terminal Tout, the diode D1 protects the PMOS transistors M1 and M2 from the stress by the large voltage difference between the output terminal Tout with possible high level voltages and the voltage source VPP which may be 0V during the power-down mode. Further, the diode D1 also blocks a current path between the output terminal Tout and the voltage source VPP. According to the above description, when the output terminal Tout is at the high level such as 3.3V during the power-down mode, the PMOS transistors M1 and M2 may not suffer the stress by the large voltage difference, and the significant voltage differences of the NMOS transistors M3 and M4 are in the safe region, such that the PMOS transistors M1 and M2 and the NMOS transistors M3 and M4 may not be damaged by the output terminal Tout with the high level such as 3.3V. Moreover, due to the diode D1, there is no leakage current between the output terminal Tout and the voltage source VPP (which may be at ground voltage), resulting in decreased power consumption.

According to the embodiment, the output buffer 1 has high voltage tolerance. When there is large voltage difference between the output terminal Tout and the reference voltage GND and between the output terminal Tout and the voltage source VPP, the PMOS transistors M1 and M2 and the NMOS transistors M3 and M4 may not be damaged, and the voltage differences of the PMOS transistors M1 and M2 and NMOS transistors M3 and M4 are maintained below the predetermined voltage limits according to the corresponding fabrication process.

Figure 2:
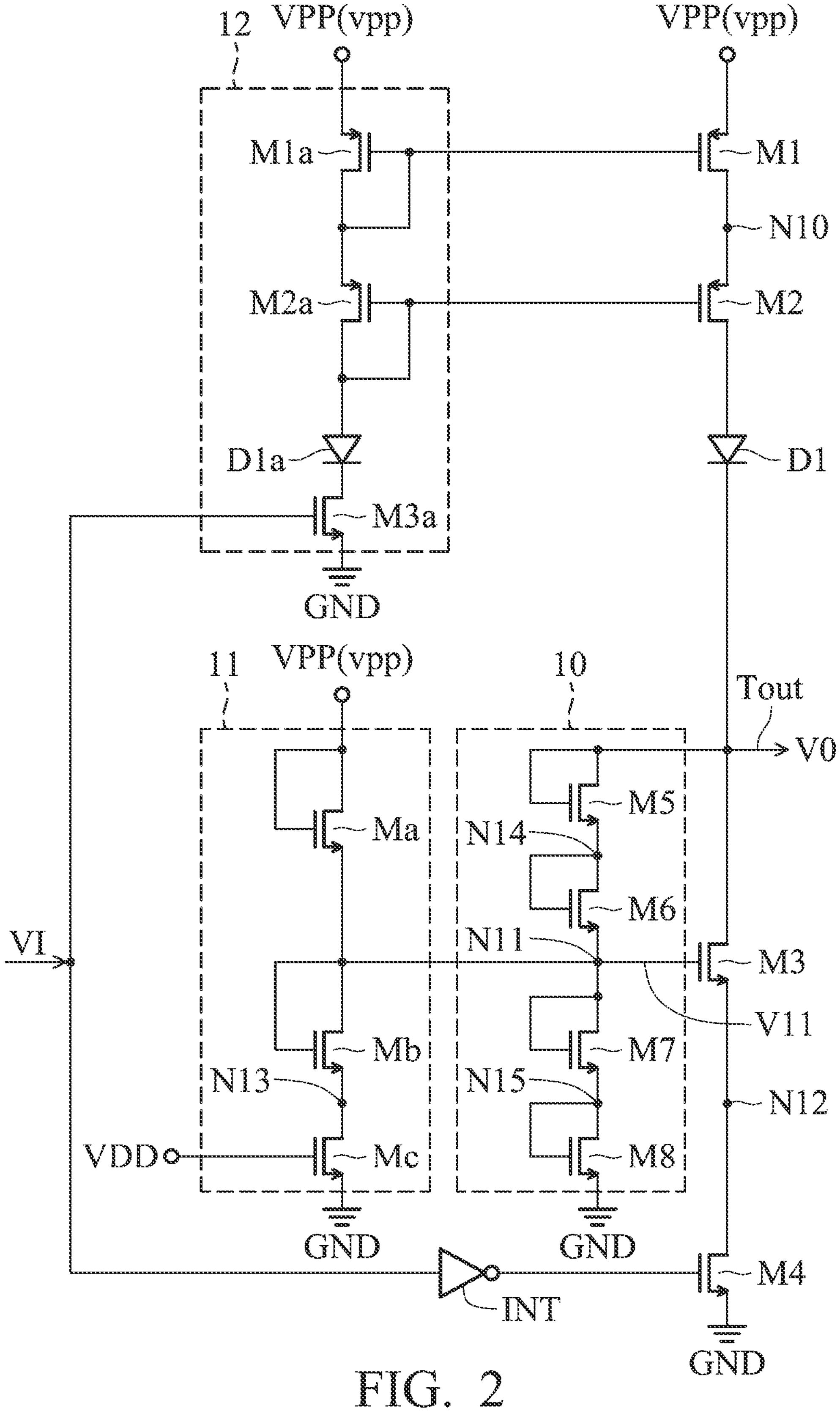
FIG. 2 shows another exemplary embodiment of an output buffer.

FIG. 2 shows detailed circuits of the self-bias circuit 10, the bias providing circuit 11, and the driving circuit 12. The bias supplying of the gate of the NMOS transistor M3 during the normal mode and the power-down mode will be described by referring to the self-bias circuit 10 and the bias providing circuit 11 in FIG. 2. As shown in FIG. 2, the bias providing circuit 11 comprises MOS transistors Ma~Mc. In the embodiment, the MOS transistors Ma~Mc are implemented by NMOS transistors which are cascaded between the voltage source VPP and the reference voltage GND. Each of the MOS transistors Ma~Mc has a control electrode, an input electrode, and an output electrode. One joint node of the NMOS transistors Ma~Mc is coupled to the gate of the NMOS transistor M3 at the node N11; that is, the node N11 serves as this joint node. The gate, drain, and source of an NMOS transistor serve as the control electrode, the input electrode, and the output electrode of each of the MOS transistors Ma~Mc, respectively. The gate and drain of the NMOS transistor Ma are coupled to the voltage source VPP, and the source thereof is coupled to the joint node coupled to the gate of the NMOS transistor M3 (that is the node N11). The gate and drain of the NMOS transistor Mb are coupled to the joint node N11, and the drain thereof is coupled to a joint node N13. The gate of the NMOS transistor Mc receives a bias voltage vdd from a voltage source VDD, the drain thereof is coupled to the joint node N13, and the source thereof is coupled to the reference voltage GND. According to the coupling structure of the NMOS transistors Ma~Mc the NMOS transistor Ma is cascaded between the voltage source VPP and the gate of the NMOS transistor M3, and the NMOS transistors Mb and Mc are cascaded between the gate of the NMOS transistor M3 and the reference voltage GND. In the embodiment, the voltage source VDD provides the operation voltage of the first IC which generates the input signal VI; that is, the input signal VI is switched between a high level of the supply voltage vdd for logic value "1" and a low level 0V for logic value "0". That is, the input signal VI has a voltage swing from the supply voltage vdd to the reference voltage GND. In one embodiment, the voltage source VDD of the first IC may have a lower voltage level than the voltage source VPP of the second IC. When the output buffer 1 operates in the normal mode, the bias providing circuit 11 generates a designated bias voltage V11 at node N11 according to the voltage sources VDD and VPP so that when the output signal VO is at the high level such as 3.3V, the voltage differences (Vgd and Vgs) between the gate and drain/source of the NMOS transistor M3 are lower than the predetermined voltage limit.

Referring to FIG. 2, the self-bias circuit 10 comprises MOS transistors M5~M8. Each of the MOS transistors M5~M8 has a control electrode, an input electrode, and an output electrode. In the embodiment, the MOS transistors M5~M8 are implemented by NMOS transistors which are cascaded between the output terminal Tout and the reference voltage GND. One joint node of the NMOS transistors M5~M8 is coupled to the gate of the NMOS transistor M3 at the node N11; that is, the node N11 serves as this joint node. The gate, drain, and source of an NMOS transistor serve as the control electrode, the input electrode, and the output electrode of each of the MOS transistors M5~M8, respectively. The gate and drain of the NMOS transistor M5 are coupled to the output terminal Tout, and the source thereof is coupled to a joint node N14. The gate and drain of the NMOS transistor M6 are coupled to the joint node N14, and the source thereof is coupled to the joint node coupled to the gate of the NMOS transistor M3 (that is the node N11). The gate and drain of the NMOS transistor M7 are coupled to the joint node N11, and the drain thereof is coupled to a joint node N15. The gate and drain of the NMOS transistor M8 are coupled to the joint node N15, and the source thereof is coupled to the reference voltage GND. According to the coupling structure of the NMOS transistors M5~M8, the NMOS transistors M5 and M6 are cascaded between the output terminal Tout and the gate of the NMOS transistor M3, and the NMOS transistors M7 and M8 are cascaded between the gate of the NMOS transistor M3 and the reference voltage GND. When the output buffer 1 operates in the power-down mode and the output terminal Tout is driven by the external circuits or ICs of the output buffer 1 to be at the high level such as 3.3V, the joint node N11 is at 1.65V due to average voltage division of the cascaded NMOS transistors M5~M8. Accordingly, the self-bias circuit 10 provides the bias voltage V11 of 1.65V to the gate of the NMOS transistor N3 to control the voltage differences (Vgd and Vgs) between the gate and drain/source of the NMOS transistor M3 to be lower than the predetermined voltage such as 1.8V. When the output buffer 1 operates in the normal mode, both the self-bias circuit 10 and the bias providing circuit 11 tend to generate the voltage V11; however, the sizes of the NMOS transistors Ma~Mc are designed to be larger than the sizes of the NMOS transistors M5~M8, so that the current in the bias providing circuit 11 is dominatingly higher than the current in the self-bias circuit 10. Accordingly, the equivalent resistance of each of the NMOS transistors Ma~Mc is less than the equivalent resistance of each of the NMOS transistors M5~M8, and the voltage V11 is determined by the bias providing circuit 11 and the effect of the self-bias circuit 10 is negligible. While two pairs of two cascaded transistors are used here as an example, the number of cascaded transistors is not limited thereto. While the diode-connected transistors Ma, Mb, and M5~M8 are used in the embodiment, they may be replaced by actual diodes.

According to the above description, by providing the bias voltage V11 from the bias providing circuit 11 during the normal mode and providing the bias voltage V11 from the self-bias circuit 10 during the power-down mode, the voltage differences (Vgd and Vgs) between the gate and drain/source of the NMOS transistor M3 are lower than the predetermined voltage such as 1.8V, such that the NMOS transistor M3 is prevented from being damaged due to gate oxide breakdown.

Further referring to FIG. 2, the driving circuit 12 is coupled to the gates of the PMOS transistors M1 and M2. When the output buffer 1 operates in the normal mode, the driving circuit 12 may control the PMOS transistors M1 and M2 according to the input signal VI and the supply voltage vpp. The driving circuit 12 comprises MOS transistors M1*a*, M2*a*, and M3*a* and a diode D1*a*. In the embodiment, the MOS transistors M1*a* and M2*a* are implemented by PMOS transistors, while the transistor M3*a* is implemented by a NMOS transistor. Each of the MOS transistors M1*a*~M3*a* has a control electrode, an input electrode, and an output electrode. The gate, source, and drain of an MOS transistor serve as the control electrode, the input electrode, and the output electrode of each of the MOS transistors M1*a*, M2*a*, and M3*a*, respectively. The gate and drain of the PMOS transistor M1*a* are coupled to the gate of the PMOS transistor M1, and the source thereof is coupled to the voltage source VPP. The gate and drain of the PMOS transistor M2*a* are coupled to the gate of the PMOS transistor M2, and the source thereof is coupled to the drain of the PMOS transistor M2*a*. The anode of the diode D1*a* is coupled to the drain of the PMOS transistor M2*a*. The gate of the NMOS transistor M3*a* receives the input signal VI, the drain thereof is coupled to the cathode of the diode D1*a*, and the source thereof is coupled to the reference voltage GND. The MOS transistors M1*a*, M2*a*, and M3*a* and the diode D1*a* are coupled in a cascaded structure. The devices M1*a*, M2*a*, and D1*a* form a mirror circuit of the devices M1, M2, and D1. During the normal mode, when the NMOS transistor M3*a* receives an input signal VI with a logic value "1" at the gate electrode, the NMOS transistor M3*a* turns on and the driving circuit 12 also turns on to generate corresponding voltages at the gates of the PMOS transistors M1*a* and M2*a*. Since the devices M1*a*, M2*a*, and D1*a* are a mirror circuit of the devices M1, M2, and D1, the NMOS transistors M1 and M2 may turn on as well according to the voltages at the gates of the NMOS transistors M1 and M2 (which are equal to the voltages at the gates of the PMOS transistors M1*a* and M2*a*, respectively), and the output signal VO may be outputted at the high level. When the NMOS transistor M3*a* receives an input signal VI with a logic value "0" at the gate electrode, the NMOS transistor M3*a* turns off and the driving circuit 12 also turns off, and thus the transistors M1 and M2 may turn off.

In summary, an output buffer with high voltage tolerance is disclosed. By providing gate voltage from a bias providing circuit during normal mode and from a self-bias circuit during power-down mode, the voltage differences of MOS transistors may be controlled below the safety voltage limit regardless of whether the output buffer is operating or not. In addition, cascaded structures of MOS transistors to reduce the stress by large voltage differences between high level voltages and the reference voltage are also provided.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An output buffer, coupled to a first voltage source providing a first supply voltage, for generating an output signal at an output terminal according to an input signal, comprising:

a first transistor having a control electrode, an input electrode coupled to the output terminal, and an output electrode;

a second transistor having a control electrode, an input electrode coupled to the output electrode of the first transistor, and an output electrode coupled to a reference voltage; and a self-bias circuit coupled to the output terminal and the control electrode of the first transistor, wherein when the output buffer does not receive the first supply voltage, the self-bias circuit provides a first bias voltage at the control electrode of the first transistor according to the output signal to decrease voltage differences between the control electrode and the input and output electrodes of the first transistor to be lower than a predetermined voltage, and wherein the output buffer further comprises a bias providing circuit, comprising:

a first bias-providing transistor having control and input electrodes directly connected to the first voltage source and an output electrode directly connected to the control electrode of the first transistor;

a second bias-providing transistor having control and input electrodes directly connected to the control electrode of the first transistor and an output electrode; and a third bias-providing transistor having an input electrode directly connected to the output electrode of the second bias-providing transistor, a control electrode directly connected to a second voltage source providing a second supply voltage, and an output electrode directly connected to the reference voltage, wherein when the output buffer receives the first supply voltage, the bias providing circuit provides a second bias voltage at the control electrode of the first transistor according to the first supply voltage to decrease the voltage differences between the control electrode and the input and output electrodes of the first transistor to be lower than the predetermined voltage.

2. The output buffer as claimed in claim 1, wherein the self-bias circuit comprises a plurality of first diodes cascaded between the output terminal and the control electrode of the first transistor, and a plurality of second diodes cascaded between the control electrode of the first transistor and the reference voltage.

3. The output buffer as claimed in claim 1, wherein the self-bias circuit comprises a plurality of first self-bias transistors cascaded between the output terminal and the control electrode of the first transistor, and a plurality of second self-bias transistors cascaded between the control electrode of the first transistor and the reference voltage.

4. The output buffer as claimed in claim 3, wherein among the plurality of first self-bias transistors, a third transistor has a control and input electrodes coupled to the output terminal and an output electrode, wherein among the plurality of first self-bias transistors, a fourth transistor has a control and input electrodes coupled to the output electrode of the third transistor and an output electrode coupled to the control electrode of the first transistor;

wherein among the plurality of second self-bias transistors, a fifth transistor has a control and input electrodes coupled to the control electrode of the first transistor and an output electrode, and wherein among the plurality of second self-bias transistors, a sixth transistor has a control and input electrodes coupled to the output electrode of the fifth transistor and an output electrode coupled to the reference voltage.

5. The output buffer as claimed in claim 1, wherein the output signal has a voltage swing from the first supply voltage to the reference voltage, and wherein the input signal has a voltage swing from the second supply voltage to the reference voltage.

6. The output buffer as claimed in claim 1, wherein a high level of the output signal is higher than a high level of the input signal.

7. The output buffer as claimed in claim 1, further comprising:

an inverter having an input terminal receiving the input signal and an output terminal coupled to the control electrode of the second transistor.

8. An output buffer, coupled to a first voltage source providing a first supply voltage, for generating an output signal at an output terminal according to an input signal, comprising:

a first transistor having a control electrode, an input electrode coupled to the first voltage source, and an output electrode;

a second transistor having a control electrode, an input electrode coupled to the output electrode of the first transistor, and an output electrode;

a first diode having an anode coupled to the output electrode of the second transistor and a cathode coupled to the output terminal;

a third transistor having a control electrode, an input electrode coupled to the output terminal, and an output electrode;

a fourth transistor having a control electrode, an input electrode coupled to the output electrode of the third transistor, and an output electrode coupled to a reference voltage; and a self-bias circuit coupled to the output terminal and the control electrode of the third transistor, wherein when the output buffer does not receive the first supply voltage, the self-bias circuit provides a first bias voltage at the control electrode of the third transistor according to the output signal to decrease voltage differences between the control electrode and the input and output electrodes of the third transistor to be lower than a predetermined voltage, wherein the control electrodes of the first transistor and the second transistor are controlled according to the input signal, wherein the output buffer further comprises a bias providing circuit, comprising:

a first bias-providing transistor having control and input electrodes directly connected to the first voltage source and an output electrode directly connected to the control electrode of the third transistor;

a second bias-providing transistor having control and input electrodes directly connected to the control electrode of the third transistor and an output electrode; and a third bias-providing transistor having an input electrode directly connected to the output electrode of the second bias-providing transistor, a control electrode directly connected to a second voltage source providing a second supply voltage, and an output electrode directly connected to the reference voltage, wherein when the output buffer receives the first supply voltage, the bias providing circuit provides a second bias voltage at the control electrode of the third transistor according to the first supply voltage to decrease the voltage differences between the control electrode and the input and output electrodes of the third transistor to be lower than the predetermined voltage.

9. The output buffer as claimed in claim 8, wherein the self-bias circuit comprises a plurality of first diodes cascaded between the output terminal and the control electrode of the third transistor, and a plurality of second diodes cascaded between the control electrode of the third transistor and the reference voltage.

10. The output buffer as claimed in claim 8, wherein the self-bias circuit comprises a plurality of first self-bias transistors cascaded between the output terminal and the control electrode of the third transistor, and a plurality of second self-bias transistors cascaded between the control electrode of the third transistor and the reference voltage.

11. The output buffer as claimed in claim 10, wherein among the plurality of first self-bias transistors, a fifth transistor has a control and input electrodes coupled to the output terminal and an output electrode, wherein among the plurality of first self-bias transistors, a sixth transistor has a control and input electrodes coupled to the output electrode of the fifth transistor and an output electrode coupled to the control electrode of the third transistor, wherein among the plurality of second self-bias transistors, a seventh transistor has a control and input electrodes coupled to the control electrode of the third transistor and an output electrode, and wherein among the plurality of second self-bias transistors, an eighth transistor has a control and input electrode coupled to the control electrode of the seventh transistor and an output electrode coupled to the reference voltage.

12. The output buffer as claimed in claim 8, further comprising a driving circuit driving the first and second transistors according to the input signal, wherein the driving circuit comprises:

a fifth transistor having control and output electrodes directly connected to the control electrode of the first transistor and an input electrode directly connected to the first voltage source;

a sixth transistor having control and output electrodes directly connected to the control electrode of the second transistor and an input electrode directly connected to the output electrode of the fifth transistor;

a second diode having an anode directly connected to the output electrode of the sixth transistor and a cathode; and a seventh transistor having a control electrode receiving the input signal, an input electrode directly connected to the cathode of the second diode, and an output directly electrode connected to the reference voltage.

13. The output buffer as claimed in claim 8, wherein the output signal has a voltage swing from the first supply voltage to the reference voltage, and wherein the input signal has a voltage swing from the second supply voltage to the reference voltage.

14. The output buffer as claimed in claim 8, wherein a high level of the output signal is higher than a high level of the input signal.

15. The output buffer as claimed in claim 8, further comprising:

an inverter having an input terminal receiving the input signal and an output terminal coupled to the control electrode of the fourth transistor.

16. An output buffer for generating an output signal at an output terminal according to an input signal, comprising:

a first transistor having a control electrode, an input electrode coupled to a voltage source, and an output electrode;

a second transistor having a control electrode, an input electrode coupled to the output electrode of the first transistor, and an output electrode;

a first diode having an anode connected to the output electrode of the second transistor and a cathode connected to the output terminal; and a driving circuit driving the first and second transistor according to the input signal, comprising:

a third transistor having control and output electrodes directly connected to the control electrode of the first transistor and an input electrode directly connected to the voltage source;

a fourth transistor having control and output electrodes directly connected to the control electrode of the second transistor and an input electrode directly connected to the output electrode of the third transistor;

a second diode having an anode directly connected to the output electrode of the fourth transistor and a cathode; and a fifth transistor having a control electrode receiving the input signal, an input electrode directly connected to the cathode of the second diode, and an output electrode directly connected to a reference voltage.

17. The output buffer as claimed in claim 16, wherein a high level of the output signal is higher than a high level of the input signal.

* * * * *